United States Patent
Kock et al.

(10) Patent No.: US 9,287,232 B2
(45) Date of Patent: Mar. 15, 2016

(54) METHOD FOR PRODUCING A HIGH-TEMPERATURE AND TEMPERATURE-CHANGE RESISTANT CONNECTION BETWEEN A SEMICONDUCTOR MODULE AND A CONNECTION PARTNER

(75) Inventors: Mathias Kock, Gokels (DE); Ronald Eisele, Surendorf (DE)

(73) Assignee: Danfoss Silicon Power GmbH, Schleswig (DE)

( * ) Notice: Subject to any disclaimer, the term of this patent is extended or adjusted under 35 U.S.C. 154(b) by 0 days.

(21) Appl. No.: 13/148,848

(22) PCT Filed: Feb. 4, 2010

(86) PCT No.: PCT/DE2010/000127
§ 371 (c)(1),
(2), (4) Date: Oct. 18, 2011

(87) PCT Pub. No.: WO2010/091660
PCT Pub. Date: Aug. 19, 2010

(65) Prior Publication Data
US 2012/0037688 A1 Feb. 16, 2012

(30) Foreign Application Priority Data

Feb. 13, 2009 (DE) .......... 10 2009 008 926

(51) Int. Cl.
*B23K 1/20* (2006.01)
*H01L 23/00* (2006.01)
*H01L 25/00* (2006.01)

(52) U.S. Cl.
CPC ........... *H01L 24/33* (2013.01); *H01L 24/27* (2013.01); *H01L 24/29* (2013.01); *H01L 24/83* (2013.01);
(Continued)

(58) Field of Classification Search
USPC ............... 228/179.1, 193, 248.1, 208
See application file for complete search history.

(56) References Cited

U.S. PATENT DOCUMENTS 4,810,672 A 3/1989 Schwarzbauer
4,856,185 A * 8/1989 Baumgartner et al. ......... 29/840
(Continued)

FOREIGN PATENT DOCUMENTS

DE 102006033073 B3 2/2008
EP 0 242 626 A2 10/1987
(Continued)

OTHER PUBLICATIONS

Zhang Zhiye et al: "Nanoscale Silver Sintering for High-Temperature Packaging of Semiconductor Devices", Materials Processing and Manufacturing Division Fifth Global Symposium. Surfaces and Interfaces in Nanostructured Materials and Trends in Liga, Miniaturization and Nanoscale Materials, 2004, pp. 129-135, XP001248317, the whole document.

(Continued)

*Primary Examiner* — Devang R Patel
*Assistant Examiner* — Carlos Gamino
(74) *Attorney, Agent, or Firm* — McCormick, Paulding & Huber LLP

(57) ABSTRACT

The invention relates to a method for producing a connection between a semiconductor component and semiconductor component and semiconductor module resistant to high temperatures and temperature changes by means of a temperature impinging process, wherein a metal powder suspension is applied to the areas of the semiconductor module to be connected later; the suspension layer is dried, outgassing the volatile components and generating a porous layer; the porous layer is pre-sealed without complete sintering taking place throughout the suspension layer; and, in order to obtain a solid electrically and thermally conductive connection of a semiconductor module to a connection partner from the group of: substrate, further semiconductor or interconnect device, the connection is a sintered connection generated without compression by increasing the temperature and made of a dried metal powder suspension that has undergone a first transport-safe contact with the connection partner in a pre-compression step and has been solidified at zero pressure using temperature sintering.

15 Claims, 2 Drawing Sheets

(52) U.S. Cl.
CPC ....... *H01L 25/50* (2013.01); *H01L 2224/27505* (2013.01); *H01L 2224/29101* (2013.01); *H01L 2224/29339* (2013.01); *H01L 2224/32145* (2013.01); *H01L 2224/48091* (2013.01); *H01L 2224/48472* (2013.01); *H01L 2224/73265* (2013.01); *H01L 2224/83065* (2013.01); *H01L 2224/83075* (2013.01); *H01L 2224/8384* (2013.01); *H01L 2224/83193* (2013.01); *H01L 2224/83207* (2013.01); *H01L 2224/83801* (2013.01); *H01L 2224/92247* (2013.01); *H01L 2924/0102* (2013.01); *H01L 2924/014* (2013.01); *H01L 2924/01005* (2013.01); *H01L 2924/01006* (2013.01); *H01L 2924/01033* (2013.01); *H01L 2924/01047* (2013.01); *H01L 2924/01057* (2013.01); *H01L 2924/01079* (2013.01); *H01L 2924/01082* (2013.01); *H01L 2924/10253* (2013.01); *H01L 2924/19041* (2013.01); *H01L 2924/19043* (2013.01)

(56) References Cited

U.S. PATENT DOCUMENTS

| | | | | |
|---|---|---|---|---|
| 4,902,648 | A | * | 2/1990 | Ohta et al. ............ 438/55 |
| 5,125,557 | A | * | 6/1992 | Tanaka et al. .......... 228/121 |
| 6,069,380 | A | * | 5/2000 | Chou et al. ............. 257/315 |
| 6,935,556 | B2 | * | 8/2005 | Knapp .................. 228/248.1 |
| 7,432,654 | B2 | * | 10/2008 | Terao et al. ............. 313/585 |
| 7,770,781 | B2 | * | 8/2010 | Shibata et al. .......... 228/248.1 |
| 7,789,287 | B2 | * | 9/2010 | Ogashiwa et al. ....... 228/110.1 |
| 7,955,411 | B2 | * | 6/2011 | Yasuda et al. ............ 75/228 |
| 2005/0098610 | A1 | * | 5/2005 | Onobori et al. ......... 228/180.21 |
| 2005/0127134 | A1 | | 6/2005 | Lu et al. |
| 2006/0091532 | A1 | * | 5/2006 | Sung ...................... 257/720 |
| 2008/0011811 | A1 | * | 1/2008 | Kwon et al. ............ 228/110.1 |
| 2008/0145607 | A1 | | 6/2008 | Kajiwara et al. |
| 2008/0173398 | A1 | * | 7/2008 | Yasuda et al. ........... 156/326 |

FOREIGN PATENT DOCUMENTS

| | | | |
|---|---|---|---|
| JP | 2008010703 A | | 1/2008 |
| WO | WO 2008006340 A1 | * | 1/2008 |
| WO | 2008081758 A1 | | 7/2008 |
| WO | 2009012450 A1 | | 1/2009 |
| WO | 2009015984 A2 | | 2/2009 |

OTHER PUBLICATIONS

Minoru Maruyama et al: "Silver nanosintering: a lead-free alternative to soldering", Applied Physics A; Materials Science & Processing, Springer, Berlin, DE, vol. 93, No. 2, Jul. 19, 2008, pp. 467-470, XP019626913, ISSN: 1432-0630, DOI: 10.1007/s00339-008-4807-5, the whole document.

International Search Report for PCT/DE2010/00127 dated Mar. 29, 2011.

* cited by examiner

METHOD FOR PRODUCING A HIGH-TEMPERATURE AND TEMPERATURE-CHANGE RESISTANT CONNECTION BETWEEN A SEMICONDUCTOR MODULE AND A CONNECTION PARTNER

CROSS REFERENCE TO RELATED APPLICATIONS

This application is entitled to the benefit of and incorporates by reference essential subject matter disclosed in International Patent Application No. PCT/DE2010/000127 filed on Feb. 4, 2010 and German Patent Application No. 10 2009 008 926.8 filed Feb. 13, 2009.

FIELD OF THE INVENTION

The invention concerns a method for producing a high-temperature and temperature-change resistant connection between a semiconductor module and a connection partner.

BACKGROUND OF THE INVENTION

The growing demand for power electronics, in particular for motor vehicles (hybrid vehicles), considerably increases the number of pieces of power semiconductor components to be manufactured. In order to keep up with the costs, which must of course be kept as low as possible in connection with the motor vehicle production, the manufacturing methods are continuously optimised.

An expensive step in the manufacturing of sintered connections, as, for example, described in the DE 10 2006 033 073 B3 of the applicant, are the required pressures of more than 30 MPa for the proper sintering (known as end sintering) that must be provided by a special apparatus for a period of some seconds up to some minutes.

Otherwise, it is known from the document mentioned that after a drying and heating step and after applying just a small pressure, a sawing resistant metal powder suspension preconsolidates in such a manner that it is "fit to be sawed".

Further, from known soldering processes, it is known that a suitable heating of the workpiece enables a melting of a soldering material arranged on the workpiece for making a tight soldered connection.

SUMMARY OF THE INVENTION

The invention is now based on the new development that, by selecting a suitable metal powder suspension and activating it, either by applying a local, low pressure of, for example, 5 MPa or by heating to, for example, 250° C., the sintering process can be initiated to such an extent that a transportable fixing occurs enabling processing through further manufacturing steps.

For this purpose, an electro-technical component with metal contact faces is connected during several manufacturing steps to either a silver or gold surface of a substrate material by means of bonding, without requiring the use of a critical sintering pressure.

This makes it possible to perform the method according to the invention without expensive pressing equipment, so that the cycle rates can be substantially increased, yet still making component groups with sintered connections.

In this connection, circuit boards can be used as substrate material, for example organic conductor boards (PCB, ceramic conductor boards, DCB, metal core conductor boards, IMS or conductor leadframes, leadframes, ceramic hybrid circuit boards etc.). The electro-technical component can be an unhoused semiconductor component or a moulded, that is, a housed, semiconductor component. Electrical contact connections, SMD components and the like can also be connected by means of the bonding process according to the invention.

The difference in relation to the process known as low-temperature sintering, during which an almost isostatic pressing with pressures of 20 to 30 MPa and a simultaneous heating of the parts to be bonded to approximately 220° C. generates a connection, is that now a connection can made with significantly lower pressures in a fast cycle manner, that is, by means of heating for a period of a few seconds.

At the same time, the following disadvantages of the state of the art can be avoided:

The previously used high pressures and temperature increases induced static and dynamic stresses in materials of the bonding partners, which could, for example in connection with unhoused silicon semiconductor components and ceramic conductor boards, cause these very brittle materials to form cracks.

The natural brittleness of those materials was even made worse by the typical working methods. During sawing, the silicon chips suffered initial microcracks (known as chipping). In addition, the ceramic conductor boards were partially pre-damaged by the breaking following laser cutting.

With classical low-temperature sintering, damaging crack growth leading to destruction would not be observed before the subsequent high-pressure treatments were performed. For some non-planar components, low temperature sintering leads directly to destruction due to the component brittleness and difficult three-dimensional designs (for example SMD-resistors and SMD-capacitors), and therefore sintering in these application areas has until now not been possible.

Thus, the method according to the invention offers three advantages over the state of the art:
  Placing and fixing the electronic component is made by means of low forces, which are just sufficient for holding the component in the desired spot on the circuit board.
  Fixing and sintering are two separate processes. Fixing occurs mainly by means of adhesion of the surfaces of the bonding partners or the silver bonding layers.
  The subsequent sintering takes place, without pressing, in a heating oven at temperatures between 170° C. and 300° C. This means that, if required, it can simply be inserted in a production line for components.
  For the support of the sintering quality, the atmosphere can, for certain metal suspension layers, be replaced by an inert or reactive gas. Nitrogen, for example, is a suitable inert gas, and forming gas or an inert gas saturated with formic acid can be used as a reactive gas.

The adhesion during fixing can be likened to the adhesion of snow crystals when making snowballs. The rough surface and the possibility of compression result in adhesion without substantially reducing the layer thickness.

BRIEF DESCRIPTION OF THE DRAWINGS

Further advantages and features of the invention appear from the following description of a preferred embodiment based on the enclosed drawings, showing.

DETAILED DESCRIPTION OF THE PREFERRED EMBODIMENTS

Figure 1:
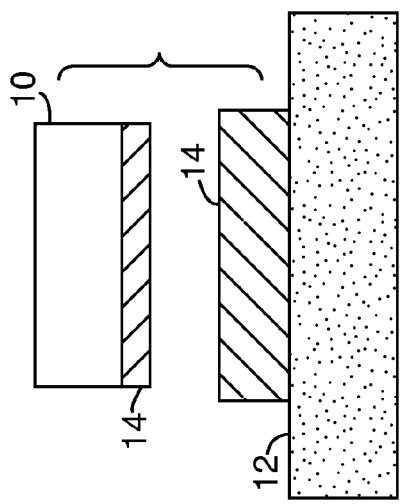
FIG. 1 shows a metallised component that is arranged over a precoated and dried metal suspension layer.

Step 1:

A substrate material or a chip rear side, or, in a preferred embodiment, both surfaces to be bonded, are provided with a layer containing silver particles and having a uniform layer thickness, preferably by means of screen printing. This provision takes place selectively in the spots on which the component will be placed, or, when applied on the chip, over the whole surface. Other application techniques, particularly spraying, can be used. Dip-coating into or spin-on of a silver particle solution, however, would cause problems with varying layer thickness.

Step 2:

After the application, the layer is dried and thus relieved of volatile, organic constituents. Temperatures of up to 150° C. support the process in order to guarantee high cycle rates. The dried layer generated in this manner has a high porosity and a high roughness.

If this step is omitted, and a "wet application" takes place, it could be feared that the still mobile silver particles in the solvent suspension would still move during the degassing, and channels for the discharge of the solvent would be formed in the layer. Such channels would be extremely undesirable since they initiate microcracks. Therefore, the complete drying of the layer is an essential part of the method, whether or not the metal suspension is provided with thermally activated constituents. Preferably, however, compositions are chosen in which a drying temperature of 150° C. does not release additional exothermal energy, but such release is only activated at a substantially higher temperature of, for example, 250° C.

In accordance with the selected composition of the metal powder suspension, and in order to accelerate the process, the drying temperature can be chosen to be so high that a premature sintering is just avoided.

Step 3:

The electro-technical component is brought to the predetermined position by an element pick and place arrangement, and one-sided or two-sided silver layers that are applied to the components are pressed into and adhere to each other by the force used during application. This is a short placing process, 0.1 to 3 seconds, the required force only being so large that the rough surfaces are deformed and mutually adhere. The holding by means of adhesion does not have to satisfy the requirements for later use, but needs only be strong enough to prevent the components from displacement during the transport process during the production.

As described above by means of the snow example, the two-dimensional adhesion of the rough dried metal layer in a silver or gold surface provides a simple adhesion. In the same manner, a snowball adheres to a concrete wall or simply to the snow itself, when a snowball is formed.

If at this stage the adhesion is not sufficient at room temperature, an increase of the temperature to, for example, 150° C., can improve the adhesion. In connection with the "snow" example, this would correspond to damp snow.

Step 4:

In a fourth step the fixed component is finally exposed to a subsequent heating process without further pressure, during which diffusion of the silver atoms into the contact surface of the bonding partner, and vice versa, takes place, so that the desired high-temperature and temperature-change resistant connection is formed that will last for many years when used with motor vehicles.

FIG. 1 shows a component 10, such as a semiconductor module, that is pre-metallised by means of the usual method, said component 10 being arranged over a connection partner such as a substrate material 12 having a metal suspension layer 14 that is precoated with approximately 50 micrometers and dried at a temperature of less than 140° C. for a few minutes (preferably 1 to 3 minutes). A suitable precompression of the layer 14 to ensure a better support and to avoid dust can be made on the layer 14 before fixing the component 10.

Further, in a variant, one of the bonding partners, e.g. the component 10, can be provided with a layer 14 that is made in the same or in a similar manner, and, merely with the purpose of using this layer 14 as a premetallising, also sintered. It is sufficient, if such a layer 14 consists of merely dried, but not sintered, paste/suspension.

Figure 2:
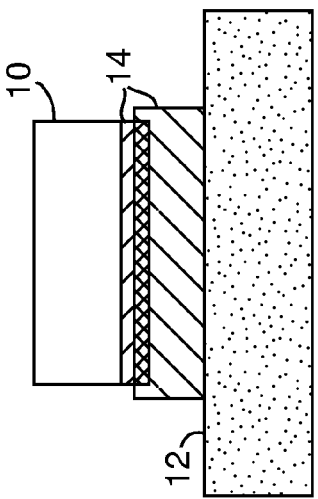
FIG. 2 shows the elements of FIG. 1 bonded by means of a low pressure.

Then, referring to FIG. 2, component 10 and the substrate material 12 are fixed to one another by means of a light pressure. In this connection, a pressure of 1 to 10 MPa, preferably 2 to 6 MPa and further preferred for one second with less than 5 MPa can be exerted.

Figure 3:
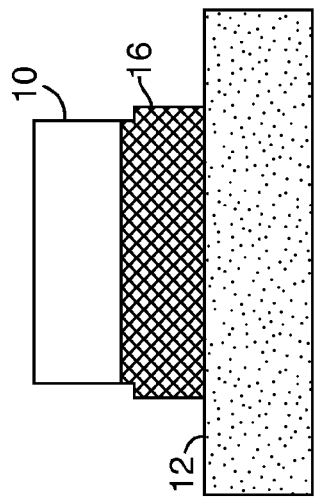
FIG. 3 shows the elements of FIG. 2 after a pressureless temperature step that ensures an advantageously complete volume sintering.

FIG. 3 shows the component 10 and the substrate material 12 of FIG. 2 after a pressureless heating step, at paste dependent temperatures of typically more than 230° C., the heating step providing a preferably complete volume sintering 16. Reactive process gases can accelerate sintering.

FIGS. 4 to 7 show how a contact tab 18 representing many possible elements, is fixed in the same way to the component 10 and the substrate material 12 by means of a light pressure.

Figure 7:
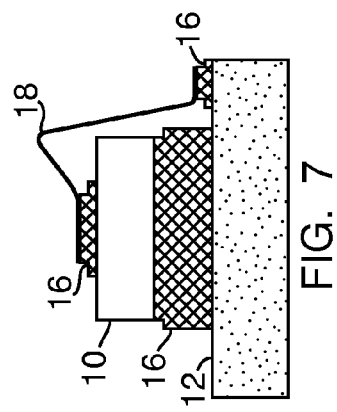
FIG. 7 shows the elements of FIG. 6 after a pressureless temperature step that ensures an advantageously complete volume sintering of all bonded contact positions.
Figure 6:
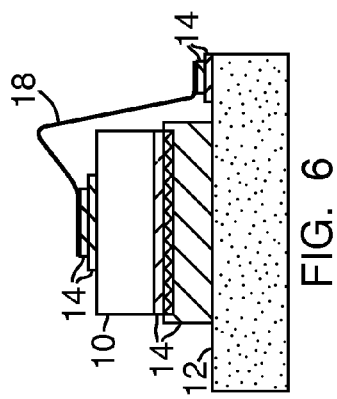
FIG. 6 shows the elements of FIG. 5, the contact tab also being bonded to the other elements using low pressure.
Figure 5:
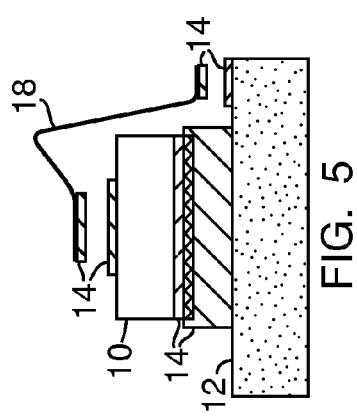
FIG. 5 shows the elements of FIG. 4, bonded by means of low pressure, and a contact tab—arranged separately—over the elements.
Figure 4:
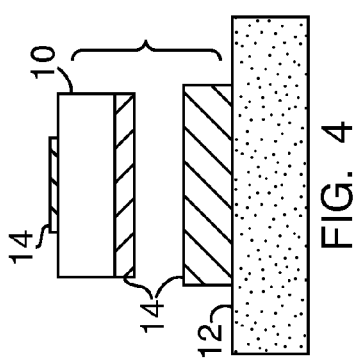
FIG. 4 shows a component metallised on lower and upper sides over a previously applied and dried metal suspension layer as in FIG. 1.

In a very advantageous manner, a light pressure on the contact tab 18 fixes it in a transportable manner to the other elements, e.g. the component 10 and the substrate material 12, and finally, with a pressureless heating step that ensures a preferably complete volume sintering 16 of all fixed contact positions (for example also many contact tabs 18), the desired high-temperature and temperature-change resistant connection is achieved that will last for many years (FIG. 7).

In a preferred embodiment, the method according to the invention for producing a high-temperature and temperature-change resistant connection between a semiconductor component and a semiconductor module by means of a temperature impinging process, in which the areas of the individual semiconductor modules to be connected are coated with a metal powder suspension, the suspension layer being dried with degassing of the volatile components and generation of a porous layer, the porous layer is subsequently precompressed without requiring a complete sintering penetrating through the whole suspension layer, whereby, for achieving a solid, electrically and thermally conducting connection of a semiconductor module to a connection partner from the group: substrate, other semiconductor or circuit board, the connection is a sintered connection generated without pressure by means of a temperature increase, the sintered connection consisting of a dried metal powder suspension that has, in a precompression step, received a first transportable contact with the connection partner and was fixed without pressure during temperature sintering, can be extended in that more than one side of a connection partner is provided with metal suspension coating.

Further, in order to improve the sintering quality, the atmosphere (in a closed chamber) can be enriched with an inert or reactive gas during heating. The major component of the inert gas can, preferably, be nitrogen. The reactive gas could be a gas, whose major component is forming gas.

While the present invention has been illustrated and described with respect to a particular embodiment thereof, it should be appreciated by those of ordinary skill in the art that various modifications to this invention may be made without departing from the spirit and scope of the present.

What is claimed is:

1. A method for producing a high-temperature and temperature-change resistant connection between a semiconductor module, a connection partner and a contact tab, by means of a temperature impinging process, in which:
   a first side and a second side of the semiconductor module to be connected to the connection partner are coated with a metal powder suspension;
   the suspension coating applied to the semiconductor module is dried with a degassing of volatile components generating a porous layer, and is precompressed prior to applying the semiconductor module to the connection partner;
   a first transportable component is formed by fixing the semiconductor module to the connection partner on one of the first or second sides of the semiconductor module by pressing the connection partner to penetrate into the dried suspension coating prior to a complete sintering penetrating through the whole suspension coating;
   a contact tab is introduced to the first or second side of the semiconductor module opposite the connection partner with low pressure; and
   the semiconductor module is thermally and electrically connected to the connection partner and to the contact tab through temperature sintering without application of pressure.

2. The method of claim 1 wherein in order to improve the sintering quality, an atmosphere, during sintering, is enriched with an inert or reactive gas.

3. The method of claim 2, wherein the gas comprises principally nitrogen.

4. The method of claim 3, wherein the gas is forming gas.

5. The method of claim 1, wherein the connection partner is a substrate.

6. The method of claim 1, wherein the connection partner is a semiconductor.

7. The method of claim 1, wherein the connection partner is a circuit board.

8. A method for producing a high-temperature and temperature-change resistant connection between a component, a connection partner and a contact tab, the method comprising:
   coating a first side and a second side of the component with a metal powder suspension;
   drying the metal suspension coating applied to the component with a degassing of volatile components generating a porous layer;
   precompressing the dried metal suspension coating;
   forming a first transportable component by fixing the component to the connection partner on one of the first or second sides of the component by pressing the connection partner to penetrate into the dried metal suspension coating prior to a complete sintering penetrating through the whole suspension coating;
   introducing a contact tab to the first or second side of the component opposite the connection partner with low pressure; and
   thermally and electrically connecting the component to the connection partner and to the contact tab through temperature sintering without application of pressure.

9. The method of claim 8, wherein the component is a semiconductor.

10. The method of claim 8, wherein in order to improve the sintering quality, an atmosphere, during sintering, is enriched with an inert or reactive gas.

11. The method of claim 10, wherein the gas comprises principally nitrogen.

12. The method of claim 11, wherein the gas is forming gas.

13. The method of claim 8, wherein the connection partner is a substrate.

14. The method of claim 8, wherein the connection partner is a semiconductor.

15. The method of claim 8, wherein the connection partner is a circuit board.

* * * * *